(12) United States Patent
Enicks

(10) Patent No.: US 8,471,244 B2
(45) Date of Patent: Jun. 25, 2013

(54) METHOD AND SYSTEM FOR PROVIDING A METAL OXIDE SEMICONDUCTOR DEVICE HAVING A DRIFT ENHANCED CHANNEL

(75) Inventor: Darwin Gene Enicks, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 190 days.

(21) Appl. No.: 11/633,839

(22) Filed: Dec. 5, 2006

(65) Prior Publication Data
US 2008/0128750 A1 Jun. 5, 2008

(51) Int. Cl.
*H01L 29/06* (2006.01)
*H01L 31/00* (2006.01)

(52) U.S. Cl.
USPC .......... 257/19; 257/191; 257/E27.06

(58) Field of Classification Search
USPC ............. 257/19, 191, E27.06
See application file for complete search history.

(56) References Cited

U.S. PATENT DOCUMENTS

| | | | |
|---|---|---|---|
| 4,994,866 A * | 2/1991 | Awano | 257/190 |
| 5,302,841 A | 4/1994 | Yamazaki | |
| 5,436,474 A | 7/1995 | Banarjee et al. | |
| 5,777,364 A * | 7/1998 | Crabbe et al. | 257/347 |
| 6,255,674 B1 | 7/2001 | Luy et al. | |
| 6,531,369 B1 | 3/2003 | Ozkan et al. | |
| 6,723,622 B2 * | 4/2004 | Murthy et al. | 438/507 |
| 6,750,484 B2 | 6/2004 | Lippert et al. | |
| 2003/0052406 A1 | 3/2003 | Lochtefeld et al. | |
| 2006/0125010 A1 | 6/2006 | Bhattacharyya | |
| 2006/0263962 A1* | 11/2006 | Weiner | 438/199 |

FOREIGN PATENT DOCUMENTS

WO WO-2008/070748 A3 6/2008

* cited by examiner

*Primary Examiner* — Phat X Cao
(74) *Attorney, Agent, or Firm* — Fish & Richardson P.C.

(57) ABSTRACT

A method and system for providing a metal oxide semiconductor (MOS) device are described. The method and system include providing a source, a drain, and a channel residing between the source and the drain. At least a portion of the channel includes an alloy layer including an impurity having a graded concentration. The method and system also include providing a gate dielectric and a gate electrode. At least a portion of the gate dielectric resides above the alloy layer. The gate dielectric resides between the alloy layer and the gate electrode.

17 Claims, 7 Drawing Sheets

US 8,471,244 B2

METHOD AND SYSTEM FOR PROVIDING A METAL OXIDE SEMICONDUCTOR DEVICE HAVING A DRIFT ENHANCED CHANNEL

FIELD OF THE INVENTION

The present invention relates to semiconductor processing, and more particularly to a method and system for providing a metal oxide semiconductor (MOS) device having a drift enhanced channel.

BACKGROUND OF THE INVENTION

In some technologies, such as heterojunction bipolar transistor (HBT) devices, alloys such as SiGe may be used. In a SiGe HBT device, the base is formed in a SiGe layer and resides between an emitter and a collector. SiGe layers are provided by growing a layer in which Ge impurities are added to the Si lattice. In drift coupled SiGe HBT devices, the Ge profile may vary across the SiGe layer. The graded profile of the Ge provides energy band offsets that induce a drift field on charge carriers. Such conventional SiGe HBT devices may provide advantages over a silicon bipolar junction transistor in gain, frequency response, and noise parameters.

Another semiconductor technology includes MOS devices. FIG. 1 depicts a conventional MOS device 10. The MOS device 10 includes a includes a P-well 14 and an N-well 14' formed in the substrate 12, as well as NMOS device 16 formed in the P-well 14 and a PMOS device 16' formed in the N-well 14'. The NMOS device 16 includes a source 18, a drain 20, a channel 22, gate oxide 24, and a gate electrode 26. The source 18 and drain 20 have the same conductivity type, n+. The channel 20 is a p-type channel. The PMOS device 16' includes a source 18', a drain 20', a channel 22', gate oxide 24', and a gate electrode 26'. The source 18' and drain 20' have the same conductivity type, p+. The channel 20' is an n-type channel.

Current applications for semiconductor devices, such as the conventional MOS device 10, may require the conventional MOS device 10 to consume less power and have a higher speed. In order to meet such criteria, the conventional MOS device 10 is made smaller. Such a small conventional MOS device 10 pushes lithographic scaling limits. Consequently, strained silicon, high electron mobility transistor (HEMT), HHMT, and other exotic MOS technologies are increasingly being employed in fabricating the conventional MOS device 10.

Although small MOS devices 10 may be used, one of ordinary skill in the art will recognize that there are drawbacks. For example, the conventional MOS device 10 may suffer from a significant leakage current. In the linear region, the current for a conventional NMOS device 16 is given by:

$$I_{DS}=(1/2L)\mu_n C_{ox} W[2(V_{GS}-V_T)V_{DS}-V_{DS}^2]; \quad (1)$$

where $V_{DS}$=applied bias voltage
L=length of channel

As can be seen in Eqn. (1), even for a zero applied voltage ($V_{DS}$=0), there is a theoretically a zero current, or a zero offstage leakage current. As the lengths of the channels 22/22' are reduced, the offstage leakage current increases to the point where the MOS device 10 is never in a truly off state. This offstage leakage current penalty becomes very severe for MOS devices 10 in the sub-ninety nanometer range. This leakage current may pose significant problems to device designers because material selections other than silicon based are not yet optimized for high volume manufacturing.

Accordingly, what is needed is a method and system for reducing the offstage leakage current of the conventional MOS device 10. In addition, other mechanisms for tailoring the properties of the device continue to be desired. The present invention addresses such a need.

BRIEF SUMMARY OF THE INVENTION

A method and system for providing a metal oxide semiconductor (MOS) device are described. The method and system include providing a source, a drain, and a channel residing between the source and the drain. At least a portion of the channel includes an alloy layer including an impurity having a graded concentration. The method and system also include providing a gate dielectric and a gate electrode. At least a portion of the gate dielectric resides above the alloy layer. The gate dielectric resides between the alloy layer and the gate electrode.

According to the method and system disclosed herein, the characteristics of the MOS device may be tailored using the graded concentration.

DETAILED DESCRIPTION OF THE INVENTION

The present invention relates to semiconductor devices. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

A method and system for providing a metal oxide semiconductor (MOS) device are described. The method and system include providing a source, a drain, and a channel residing between the source and the drain. At least a portion of the channel includes an alloy layer including an impurity having a graded concentration. The method and system also include providing a gate dielectric and a gate electrode. At least a portion of the gate dielectric resides above the alloy layer. The gate dielectric resides between the alloy layer and the gate electrode.

The method and system will be described in terms of particular MOS devices. However, one of ordinary skill in the art will readily recognize that the method and system may be applicable to other device(s) having other, additional, and/or different components, dopants, and/or positions not inconsistent with the method and system. In addition, one of ordinary skill in the art will recognize that for clarity, the drawings are not depicted to scale. The method and system are also described in the context of particular methods. One of ordinary skill in the art will, however, recognize that the method could have other and/or additional steps. In addition, one of ordinary skill in the art will recognize that the methods may omit or combine steps for ease of explanation. Moreover, although the methods are described in the context of providing a single MOS device, one of ordinary skill in the art will readily recognize that multiple devices may be provided in parallel and/or series. The method and system are described in the context of providing a particular layer, a SiGe layer. However, one of ordinary skill in the art will recognize that the method and system may be used in connection with other alloy layers having additional and/or other constituents. The method and system are also described in the context of particular dopant profiles. However, one of ordinary skill in the art will readily recognize that the shapes, locations, and other features of the profiles may vary, particularly as device applications vary.

Figure 1:
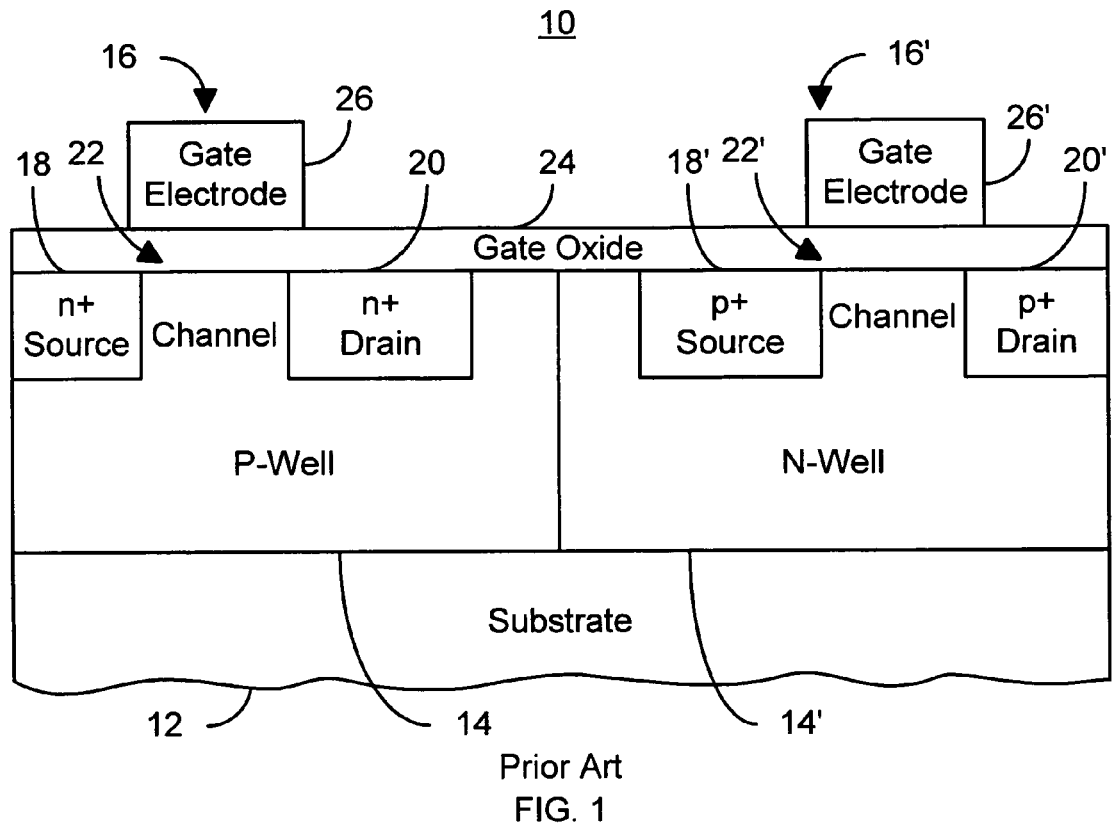
FIG. 1 is a diagram of a conventional MOS device.
Figure 2:
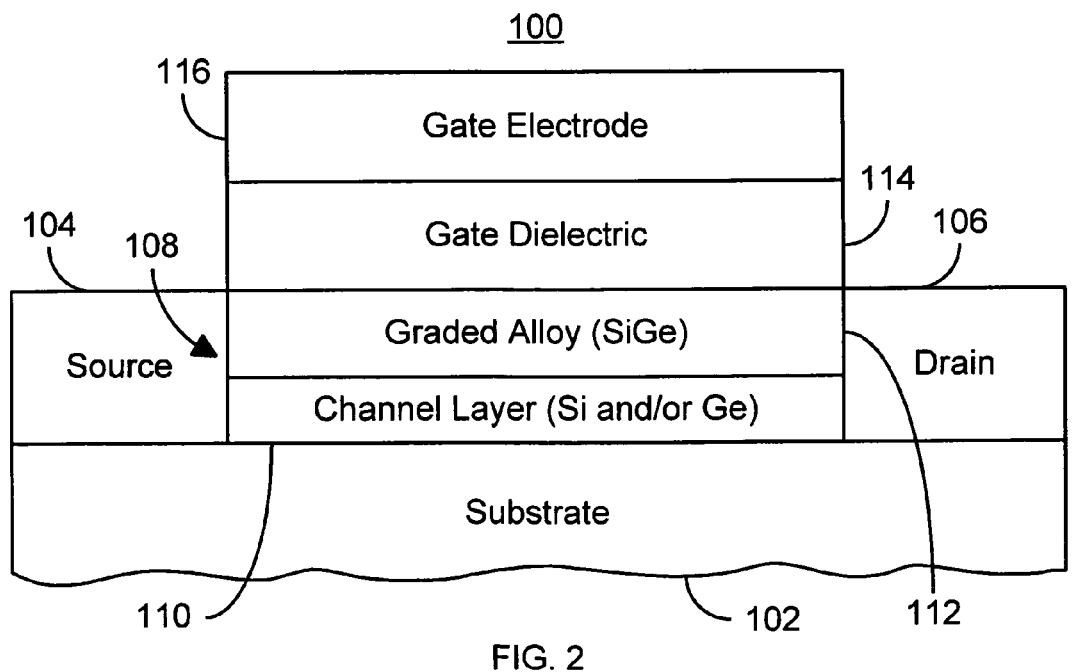
FIG. 2 is a diagram of an exemplary embodiment of a drift coupled MOS device.

To more particularly illustrate the system and method, refer to FIG. 2 depicting of an exemplary embodiment of a drift coupled MOS device 100. The MOS device 100 is formed on an underlying substrate 102 and includes a source 104, a drain 106, drift enhanced channel 108, gate dielectric 114 and gate electrode 117. The source 104 and drain 106 have the same conductivity type, which is different from the underlying substrate 102 and channel 108. For example, if the MOS device 100 is an NMOS device, source 104 and drain 106 would be n+ doped. If the MOS device 100 is a PMOS device, the source 104 and drain 106 would be p+ doped. The gate dielectric 114 is thin and preferably includes at least one of $SiO_2$, $GeO_x$, and $HfO_x$. The gate electrode 116 preferably includes silicon. In one embodiment, the gate electrode 116 is polysilicon. However, in alternate embodiments, the gate electrode 116 includes at least one of poly SiGe, epitaxial Si, epitaxial SiGe, poly Ge, and epitaxial Ge.

Figure 3:
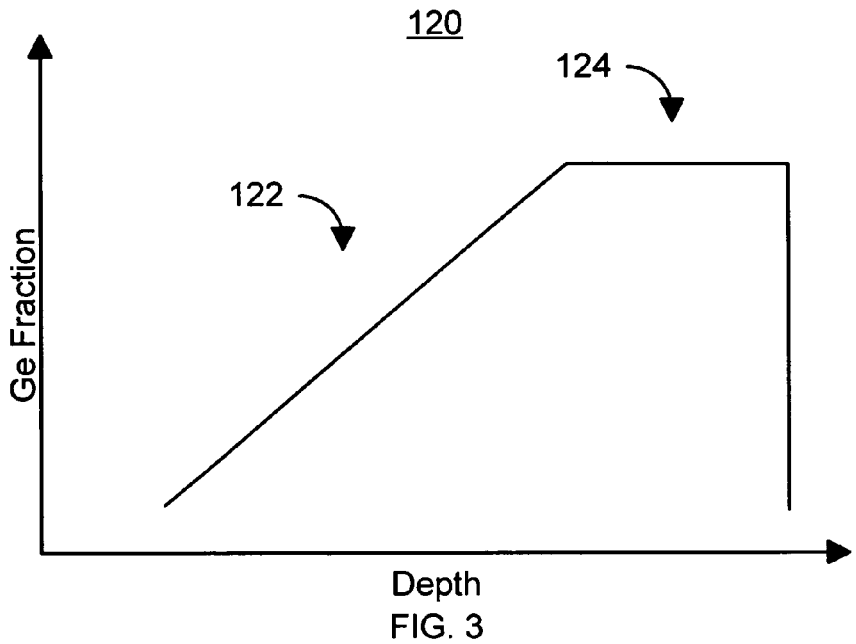
FIG. 3 is a graph depicting an exemplary embodiment of a Ge profile for one embodiment of a drift coupled MOS device.

The drift enhanced channel 108 includes two portions 110 and 112. The channel layer 110 preferably includes Si and/or Ge. If the channel layer 110 includes SiGe, then in a preferred embodiment, the concentration of the Ge is relatively constant through the channel layer. The drift enhanced channel 108 also includes a graded alloy layer 112. The graded alloy layer 112 includes impurities having a concentration that is graded. In a preferred embodiment, the graded alloy layer 112 is a graded SiGe layer 112. Consequently, the MOS device 100 is described in the context of a graded SiGe layer 112. In the graded SiGe layer 112, the concentration of Ge is graded, or varies through the thickness of the graded SiGe layer. In particular, the concentration of Ge may increase or decrease from the bottom to the top of the graded SiGe layer 112. In one embodiment, the concentration of Ge monotonically increases or decreases. In one embodiment, the concentration of Ge increases or decreases linearly through the height of the layer. For example, FIG. 3 depicts a graph 120 of Ge fraction versus the depth in one embodiment of the MOS device 100 in which the concentration of Ge increases linearly with the depth of the device and the channel layer 110 is a SiGe layer. The graded portion 122 of the graph 120 is the fraction of Ge through the graded SiGe layer 112. The relatively constant portion 124 is the fraction of Ge in the channel layer 110 for such an embodiment of the MOS device 100. In alternate embodiments, the concentration of Ge in the channel layer 110 may be different than shown in the relatively constant portion 124 and/or the shape, slope, or other aspects of the graded portion 122 may be different. In addition, in one embodiment, the concentration of Ge may be graded throughout the drift enhanced channel 108.

Through the use of the drift enhanced channel 108, particularly the graded alloy layer 112, the properties of the MOS device 100 may be further tailored. By varying characteristics of the graded portion 122 of the Ge in the SiGe layer the drift field may be varied. This drift field adds a drift velocity to the charge carriers in the channel 108. The drift field may be from the source 104 to the drain 106 or vice versa. Consequently, the magnitude and direction of the drift velocity added to the charge carriers may be customized. In one embodiment, the Ge concentration is graded in the graded SiGe layer 112 such that this drift field enhances the velocity of charge carriers in an opposite direction to which the offstage leakage current flow. In an alternate embodiment, the drift field may be in the opposite direction. In such an embodiment, the drift field may enhance the velocity of charge carriers in the same direction as the offstage leakage current. Consequently, charge carriers may have a greater velocity through the MOS device 100. Thus, the MOS device may have improved performance.

Figure 4:
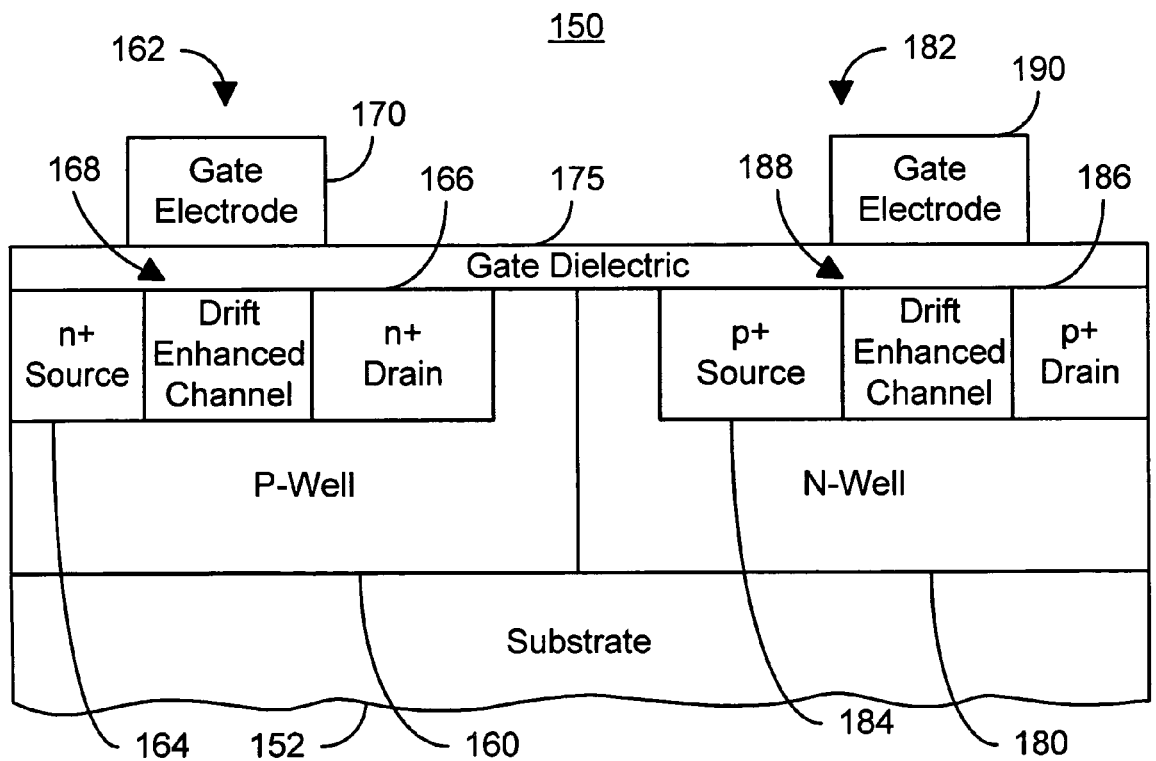
FIG. 4 is a diagram of another exemplary embodiment of a drift coupled MOS semiconductor device.

FIG. 4 is a diagram of another exemplary embodiment of a drift coupled MOS device 150. The MOS device 100 includes a includes a P-well 160 and an N-well 180 formed in the substrate 152, as well as NMOS device 162 formed in the P-well 160 and a PMOS device 180 formed in the P-well 180. The NMOS device 162 includes a source 164, a drain 166, a drift enhanced channel 168, gate oxide 175, and a gate electrode 170. The source 164 and drain 166 have the same conductivity type, n+. The PMOS device 182 includes a source 184, a drain 186, a drift enhanced channel 188, gate oxide 175, and a gate electrode 190. The source 184 and drain 186 have the same conductivity type, p+. The gate dielectric 165 includes at least one of $SiO_2$, $GeO_x$, and $HfO_x$. In addition, the gate electrodes 170 and 190 each preferably includes at least one of polysilicon, poly SiGe, epitaxial Si, epitaxial SiGe, poly Ge, and epitaxial Ge The drift enhanced channels 168 and 188 are each preferably analogous to the drift enhanced channel 108 depicted in FIG. 2. Thus, at least a portion of each of the drift enhanced channels 168 and 188 include an alloy having a graded concentration. In a preferred embodiment, each of the drift enhanced channels 168 and 188 includes SiGe having a graded Ge concentration. In one embodiment, each of the drift enhanced channels 168 and 188 includes two portions. One portion has a constant concentration of Ge (including possibly have a concentration of zero Ge) and is analogous to the layer 110. The other portion has a graded Ge concentration and is analogous to the graded layer 112. In each drift enhanced channel 168/188, therefore, the concentration of Ge is graded, or varies through the thickness of the drift enhanced channel 168/188. In particular, the concentration of Ge may increase or decrease from the bottom to the top of the portion of the drift enhanced channel 168/188. In one embodiment, the concentration of Ge monotonically increases or decreases. In one embodiment, the concentration of Ge increases or decreases linearly through the height of the layer. In alternate embodiments, the concentration of Ge in the drift enhanced channel 168/188 may be different than shown in the relatively constant portion 124 and/or the shape, slope, or other aspects of the graded portion 122 may be different. In addition, in one embodiment, the concentration of Ge may be graded throughout the drift enhanced channel 108.

Through the use of the drift enhanced channel 108, the properties of the MOS device 100 may be further tailored. By varying characteristics of the graded portion of the drift enhanced channel 168/188, the drift field in the NMOS device 162 and the PMOS device 182 may be varied. In one embodiment, the drift field for the NMOS device 162 is from the drain 166 to the source 164 while the drift field for the PMOS device is from the source 184 to the drain 186. In such an embodiment, the drift field increases electron drift for the NMOS device 162 and the PMOS device 164. In another embodiment, the drift field for the NMOS device 162 is from the source 164 to the drain 166 while the drift field for the PMOS device is from the drain 186 to the source 184. In such an embodiment, the drift field provides a barrier against subthreshold leakage for both MOS devices 162 and 182. Consequently, leakage for applied voltages less than the threshold voltages of the NMOS device 162 and the PMOS device 182 may be decreased. In another embodiment, the drift field for the NMOS device 162 is from the drain 166 to the source 164 and the drift field for the PMOS device is from the drain 186 to the source 184. In such en embodiment, the drift field provides a barrier against sub-threshold leakage for the PMOS device 182 but increases the electron drift for the NMOS device 162. In another embodiment, the drift field for the NMOS device 162 is from the source 164 to the drain 166 and the drift field for the PMOS device is from the source 184 to the drain 186. In such en embodiment, the drift field provides a barrier against sub-threshold leakage for the NMOS device 162 but increases the electron drift for the PMOS device 182. Thus, using the drift enhanced channels 168 and 188, performance of the MOS device 150 may be tailored as desired.

Figure 5:
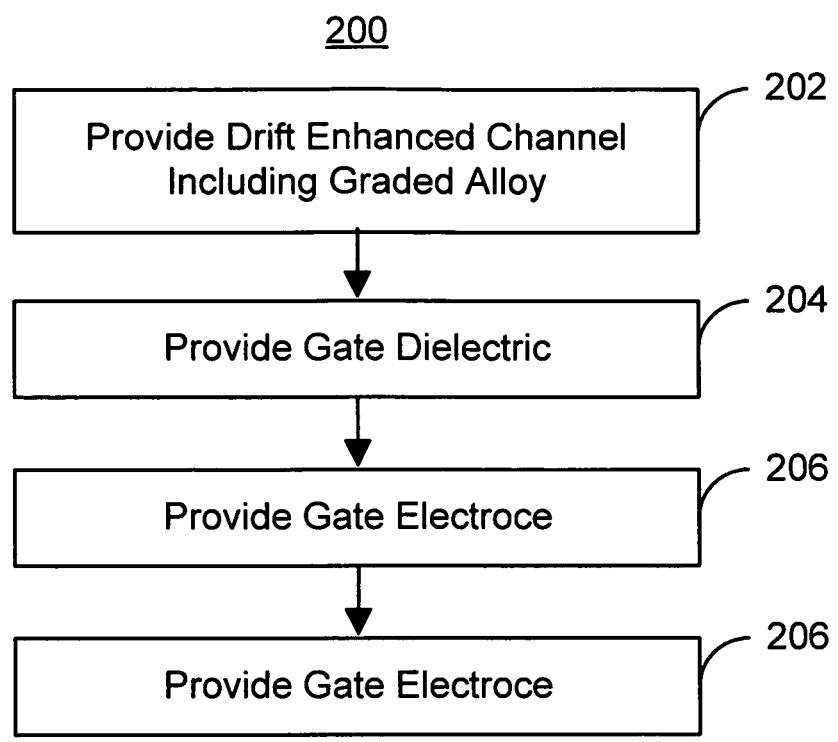
FIG. 5 is a flow chart depicting one embodiment of a method for providing a drift coupled MOS device.

FIG. 5 is a flow chart depicting one embodiment of a method 200 for providing a drift coupled MOS device. For clarity, the method 200 is described in the context of the MOS device 100 depicted in FIG. 2. However, one of ordinary skill in the art will recognize that the method 200 may be used to provide other MOS devices. Certain steps of the method 200 are described as being in a particular order. However, one of ordinary skill in the art will readily recognize that other including different and/or additional steps may be performed and that the steps may be performed in another order.

Referring to FIGS. 2 and 5, the drift enhanced channel 108 is provided, via step 202. The channel 108 provided in step 202 includes an alloy layer including an impurity having a graded concentration. Thus, step 202 preferably includes providing the graded alloy layer 112. A gate dielectric 114 is provided, via step 204. At least a portion of the gate dielectric 114 provided in step 204 resides above the graded alloy layer 112. Although the gate dielectric 114 is shown as extending only as far as the graded alloy layer 112, in another embodiment, the gate dielectric 114 may extend a different distance laterally in FIG. 2. A gate electrode 116 is provided, via step 206. Step 206 is performed such that at least a portion of the gate dielectric 114 resides between at least a portion of the gate electrode 116 and the drift enhanced channel 108. The source and drain are provided via step 208.

Thus, using the method 200, the MOS device 100 having a drift enhanced channel 108 may be provided. Consequently, the benefits of the MOS device 100 may be achieved. Furthermore, the method 100 may be performed using conventional MOS technology platforms. Thus, the benefits of the MOS device 100 may be obtained using standard MOS platforms.

Figure 6:
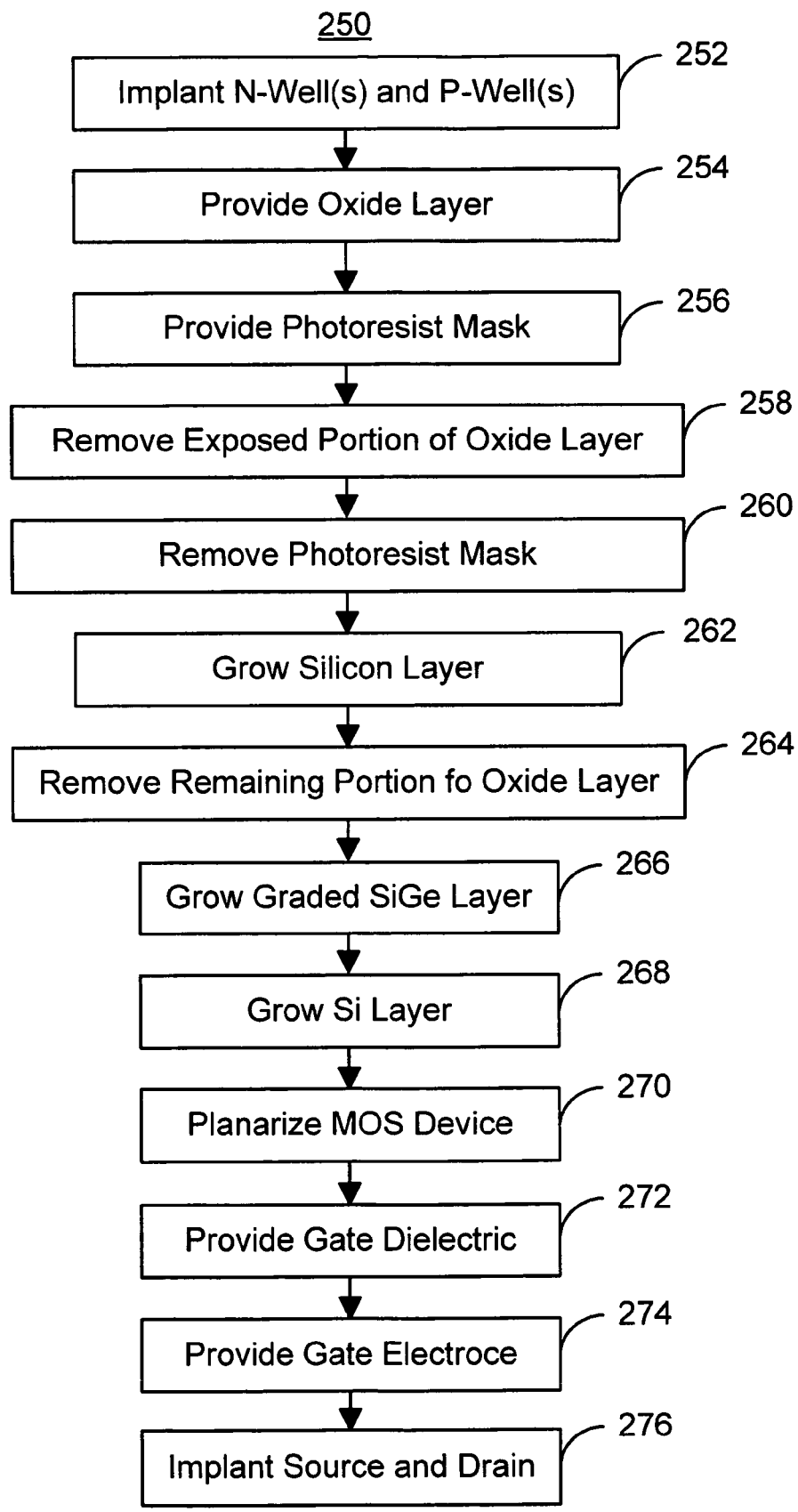
FIG. 6 is a flow chart depicting another exemplary embodiment of a method for providing a drift coupled MOS device.

FIG. 6 is a flow chart depicting another exemplary embodiment of a method 250 for providing a drift coupled MOS device, such as the MOS device 150. FIGS. 7A-7F depict an exemplary embodiment of the drift coupled MOS device 150, during fabrication. For clarity, the method 250 is described in the context of the MOS device 150 depicted in FIGS. 4 and 7A-7F. However, one of ordinary skill in the art will recognize that the method 250 may be used to provide other MOS devices. Certain steps of the method 250 are described as being in a particular order. However, one of ordinary skill in the art will readily recognize that other including different and/or additional steps may be performed and that the steps may be performed in another order.

Figure 7A:
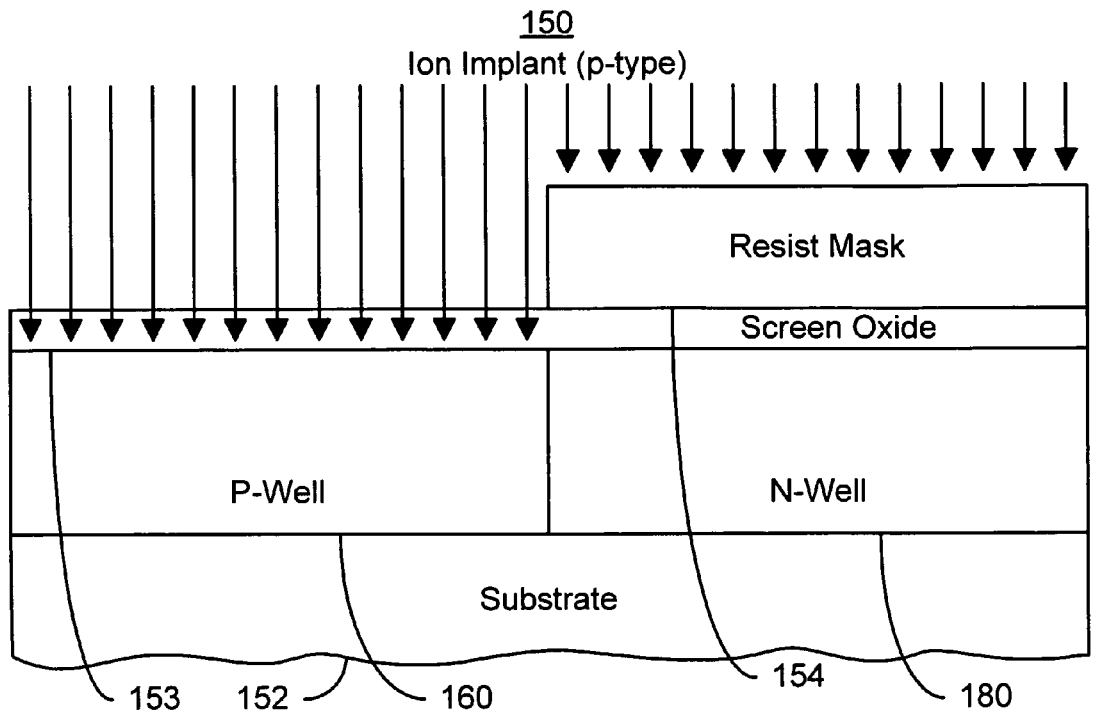
FIGS. 7A-F are diagrams depicting one exemplary embodiment of a drift coupled MOS device.

The P-well 160 and N-2 well 180 are formed, via step 252. FIG. 7A depicts the MOS device 150 during step 252. Thus, the MOS device 150 is formed on a substrate 152 and is shown as including the P-well 160 and the N-well 180. A screen oxide 153 and resist mask 154 are used. Thus, the p-type implant used in this embodiment only implants the portion of the substrate 152 in which the P-well 160 is formed. Step 252 also includes removing the resist mask 154 once formation of the wells 160 and 180 is complete.

Figure 7B:
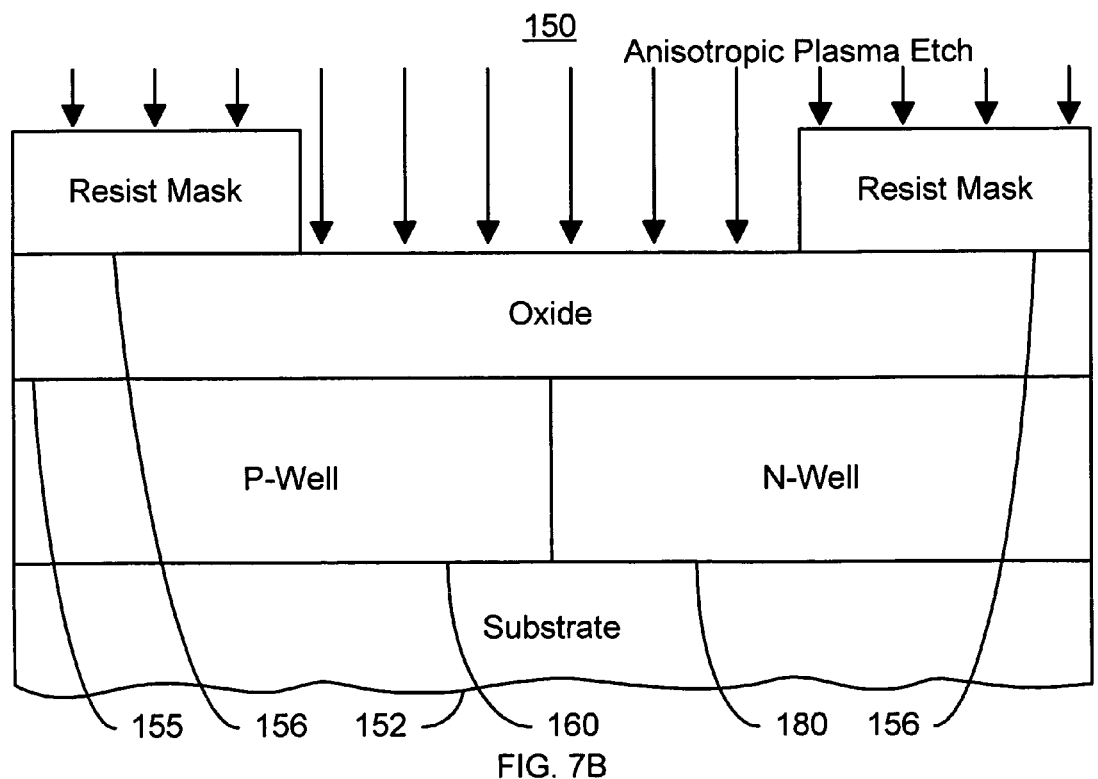

An oxide layer is provided on the MOS device 150, via step 254. Thus, the oxide layer is grown on the MOS device 150 in step 254. Another photoresist mask is provided, via step 256. The photoresist mask exposes a portion of the MOS device 150 in and around the region at which the P-well 160 and N-well 180 meet. The portion of the oxide layer grown in step 254 is removed, via step 258. Preferably, step 258 is performed using an anisotropic plasma etch. FIG. 7B depicts the MOS device 150 as step 258 is being performed using an anisotropic plasma etch. Thus, an oxide layer 155 and the resist mask 156 are shown. The anisotropic plasma etch removes the exposed portion of the oxide layer 155.

Figure 7C:
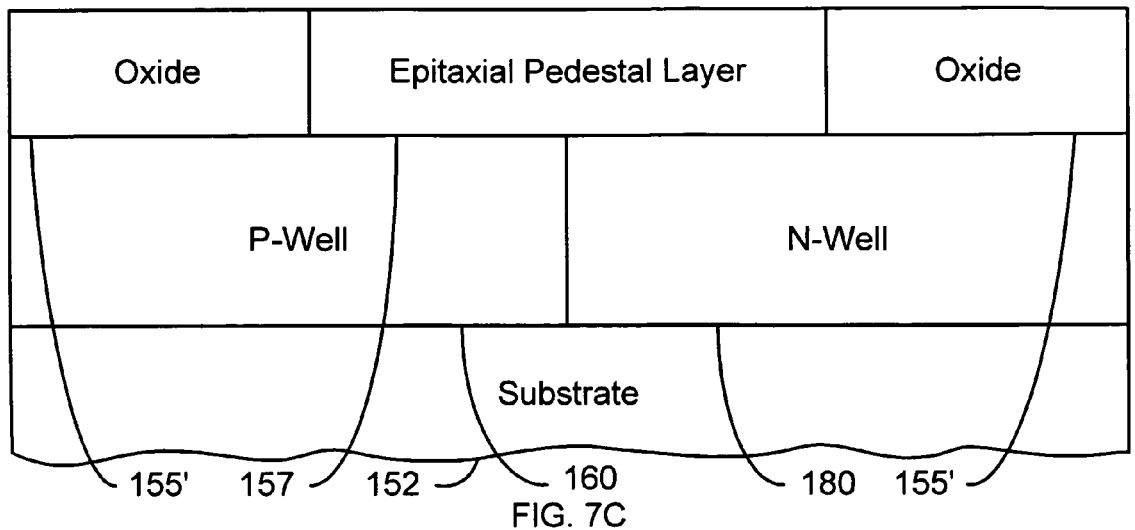
Figure 7D:
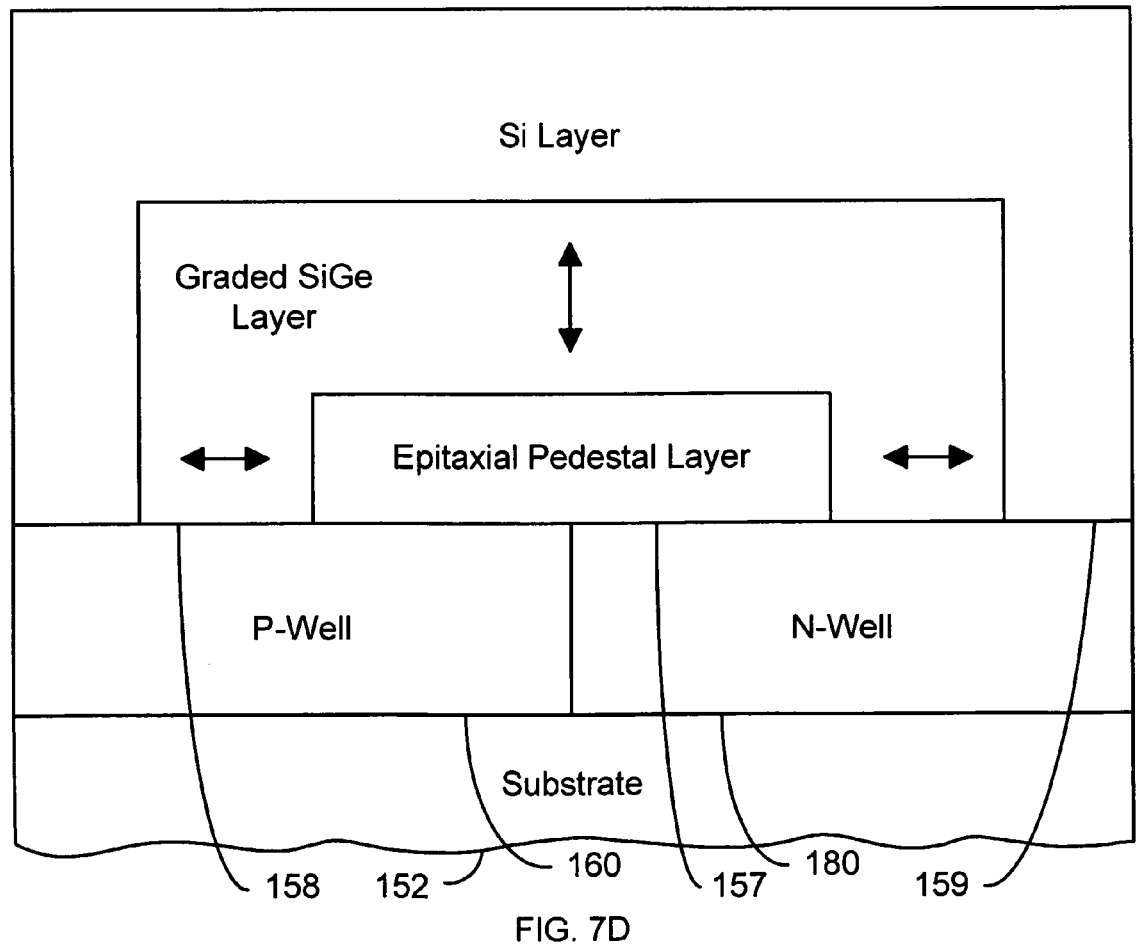

The photoresist mask 156 is removed, via step 260. An epitaxial pedestal layer is grown, via step 262. In a preferred embodiment, the epitaxial pedestal layer grown is epitaxial silicon. However, in another embodiment, the epitaxial pedestal layer grown could include an impurity such as Ge. FIG. 7C depicts the MOS device 150 after step 262 is completed. Consequently, only oxide layer portions 155' remain. In addition, an epitaxial pedestal layer 157 is shown. The remaining portions of the oxide layer 155' are removed, via step 264. A graded alloy layer is formed, via step 266. The graded alloy layer preferably is silicon with a graded concentration of Ge. This graded SiGe layer forms port of the drift enhanced channels 168 and 188. A layer of epitaxial silicon is preferably grown after the graded SiGe layer is formed, via step 268. FIG. 7D depicts the MOS device 150 after steps 264, 266, and 268 are performed. Thus, the graded SiGe layer 158 and the silicon layer 159 are shown. The arrows in FIG. 7D depict the direction which the drift field might be, depending upon the grade for the SiGe layer 158.

Figure 7E:
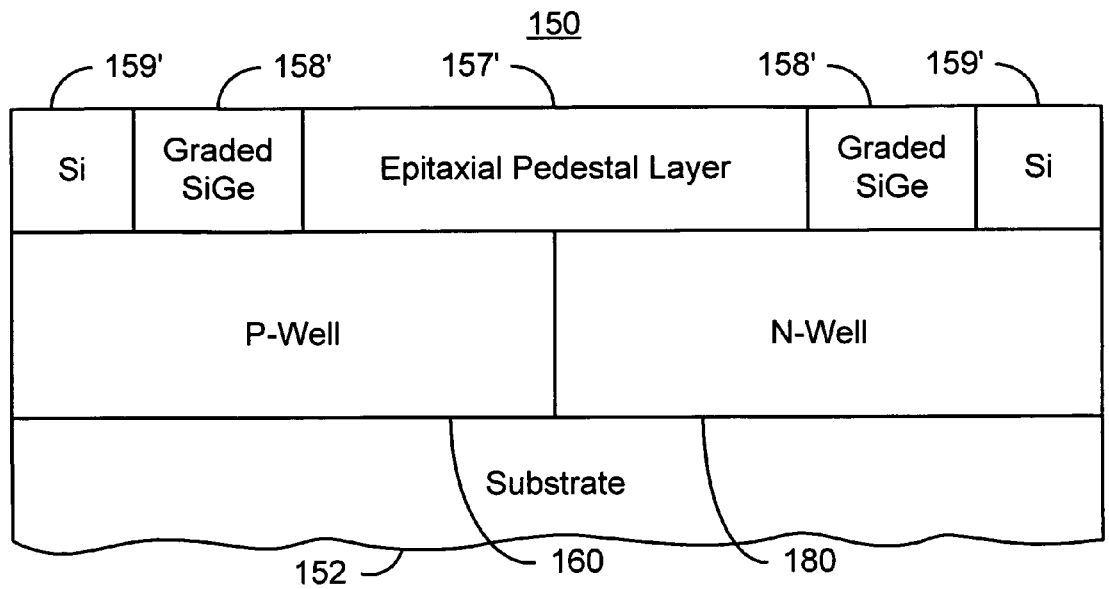

The MOS device 150 is planarized, via step 270. The planarization performed in step 270 exposes the epitaxial pedestal layer 157. FIG. 7E depicts the MOS device 150 after step 270 is performed. Consequently, the epitaxial pedestal layer 157' is exposed. In addition, significant portions of the layers 158 and 159 have been removed. As a result, graded SiGe regions 158' and Si regions 159' remain.

Figure 7F:
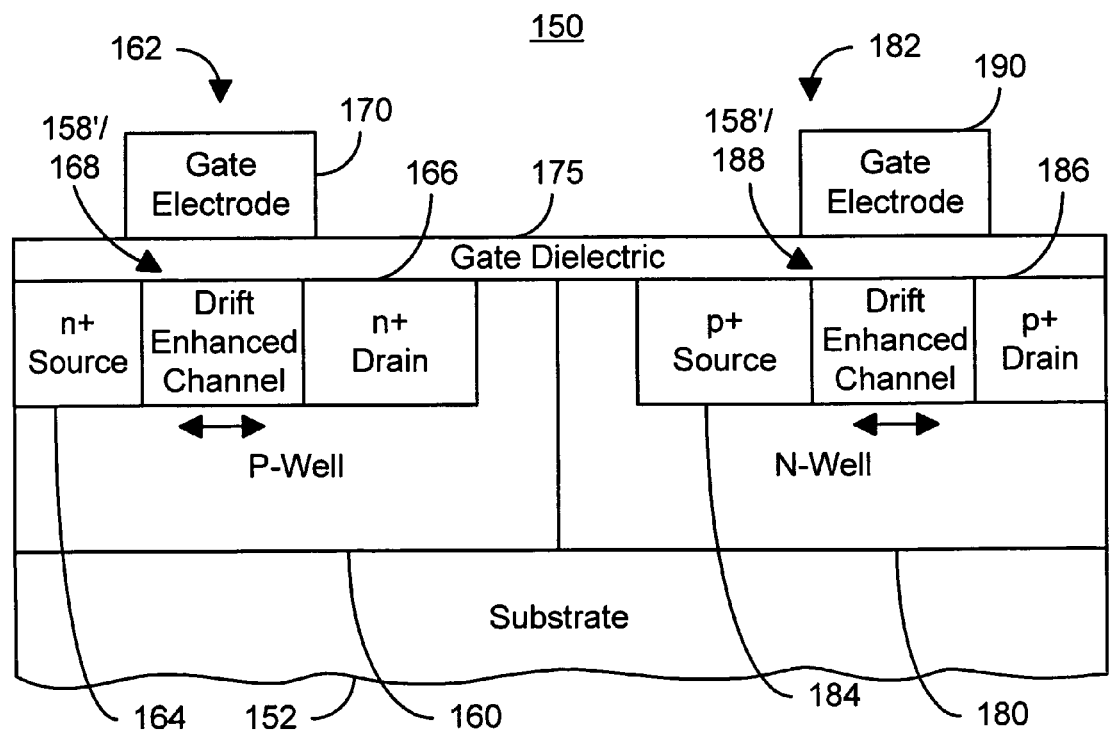

A gate dielectric is provided, via step 272. The gate dielectric 175 is provided at least one the graded SiGe layers 158'. However, in another embodiment, the gate dielectric 175 may be provided across the device. Gate electrodes are provided on the gate dielectric 175, via step 274. Source and drains are implanted, via step 276. In a preferred embodiment, two implants are provided in step 276—an n+ implant for the P-well 160 and a p+ implant for the N-well 180. FIG. 7F depicts the MOS device 150 after step 276 is completed. Thus, the graded SiGe layers 158' are depicted as the drift enhanced channels 168 and 188 of FIG. 4. In addition, the gate dielectric 175, source 164, drain 166, and gate electrode 170 of the NMOS device 162 as well as the source 184, drain 186, and gate electrode 190 of the PMOS device 182 are shown. Also shown by arrows in FIG. 7F are the possible drift directions in the drift enhanced channels 158'/168 and 158'/188 of the NMOS device 162 and PMOS device 182, respectively.

Thus, using the method 250, the MOS device 150 may be provided. In particular, depending the grading utilized in each of the drift enhanced channels 168 and 188, the properties of the NMOS device 160 and PMOS device 180 may individually tailored. For example, the leakage of each device 160 and 180 may be selectively reduced and/or the velocity of charge carriers across the devices 160 and 180 may be increased. Thus, the properties of each of the devices 160 and 180 may be further optimized.

A method and system for providing an alloy layer in a semiconductor device has been disclosed. The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

What is claimed is:

1. A semiconductor device comprising:
   a source;
   a drain;
   a channel coupled to a substrate and disposed between the source and the drain, the channel including a first portion comprising an alloy material, the alloy material including a first impurity having a graded concentration throughout the first portion, wherein the concentration of the first impurity linearly increases or decreases throughout a height of the first portion, the channel further including a second portion comprising an alloy material, the alloy material of the second portion including a second impurity with a graded concentration, wherein the second portion of the channel directly contacts a portion of the substrate and wherein the channel is configured to have a built-in drift field that adds a drift velocity to charge carriers in the channel;
   a gate dielectric, at least a portion of the gate dielectric disposed above the alloy material and
   a gate electrode, the gate dielectric disposed between the alloy material and the gate electrode, wherein the first portion of the channel directly contacts the gate dielectric.

2. The semiconductor device of claim 1 wherein the first impurity is Ge.

3. The semiconductor device of claim 1 wherein the gate dielectric includes at least one of $SiO_2$, $GeO_x$, and $HfO_x$.

4. The semiconductor device of claim 1 wherein the gate electrode includes at least one of poly silicon, poly SiGe, epitaxial Si, epitaxial SiGe, poly Ge, and epitaxial Ge.

5. The semiconductor device of claim 1 being configured to include an n-type metal oxide semiconductor (NMOS) device and a p-type metal oxide semiconductor (PMOS) device, such that the source includes a p-type source of the PMOS device and the drain includes a p-type drain of the PMOS device and such that the NMOS device includes an n-type source and an n-type drain.

6. The semiconductor device of claim 5 wherein the built-in drift field is from the n-type drain to the n-type source and from the p-type source to the p-type drain.

7. The semiconductor device of claim 5 wherein the built-in drift field is from the n-type source to the n-type drain and from the p-type drain to the p-type source.

8. The semiconductor device of claim 5 wherein the built-in drift field is from the n-type drain to the n-type source and from the p-type drain to the p-type source.

9. The semiconductor device of claim 5, wherein the built-in drift field is from the n-type source to the n-type drain and from the p-type source to the p-type drain.

10. The semiconductor device of claim 1, wherein the second impurity is Ge.

11. A semiconductor device comprising:
    a P-well;
    an N-well;
    an n-type metal oxide semiconductor (NMOS) device having an n-type source and an n-type drain disposed in the P-well, a p-type channel disposed between the n-type source and the n-type drain, a first gate electrode disposed above the p-type channel, and a first gate dielectric portion disposed between the first gate electrode and the p-type channel, the p-type channel including a first portion having a first SiGe material with a first graded Ge concentration in the first SiGe material throughout the first portion of the p-type channel, wherein the first graded Ge concentration linearly increases or decreases throughout a height of the first portion of the p-type channel, and the p-type channel including a second portion having an additional SiGe material with a graded Ge concentration, wherein the first portion of the p-type channel directly contacts the first gate dielectric portion, wherein the second portion of the p-type channel directly contacts a portion of the P-well and wherein the p-type channel is configured to have a built-in drift field that adds a drift velocity to charge carriers in the p-type channel; and
    a p-type metal oxide semiconductor (PMOS) device having a p-type source and a p-type drain disposed in the N-well, an n-type channel disposed between the p-type source and the p-type drain, a second gate electrode disposed above the n-type channel, and a second gate dielectric portion disposed between the second gate electrode and the n-type channel, the n-type channel including a first portion having a second SiGe material with a second graded Ge concentration in the second SiGe material throughout the first portion of the n-type channel, wherein the second graded Ge concentration linearly increases or decreases throughout a height of the first portion of the n-type channel, and the n-type channel including a second portion having an additional SiGe material with a graded Ge concentration, wherein the first portion of the n-type channel directly contacts the second gate dielectric portion, wherein the second portion of the n-type channel directly contacts a portion of the N-well and wherein the n-type channel is configured to have a built-in drift field that adds a drift velocity to charge carriers in the n-type channel.

12. The semiconductor device of claim 11 wherein at least one of the first and second graded Ge concentrations increases in a direction from the p-type channel to the first gate dielectric portion.

13. The semiconductor device of claim 12 wherein at least one of the first and second graded Ge concentrations increases monotonically.

14. The semiconductor device of claim 12 wherein at least one of the first and second graded Ge concentrations increases linearly.

15. The semiconductor device of claim 11 wherein at least one of the first and second graded Ge concentrations decreases in a direction from the p-type channel to the first gate dielectric portion.

16. The semiconductor device of claim 15 wherein at least one of the first and second graded Ge concentrations decreases monotonically.

17. The semiconductor device of claim 15 wherein at least one of the first and second graded Ge concentrations decreases linearly.

\* \* \* \* \*

UNITED STATES PATENT AND TRADEMARK OFFICE
CERTIFICATE OF CORRECTION

| | | |
|---|---|---|
| PATENT NO. | : 8,471,244 B2 | Page 1 of 1 |
| APPLICATION NO. | : 11/633839 | |
| DATED | : June 25, 2013 | |
| INVENTOR(S) | : Darwin Gene Enicks | |

It is certified that error appears in the above-identified patent and that said Letters Patent is hereby corrected as shown below:

In the Drawings:

1.) Figure 5, at the first reference numeral 206: delete "Electroce" and insert --Electrode--.

2.) Figure 5, at the second reference numeral 206: delete "Electroce" and insert --Electrode--.

3.) Figure 5, delete the second reference numeral "206" and insert --208--.

4.) Figure 6, at reference numeral 264: delete "fo" and insert --of--.

5.) Figure 6, at reference numeral 274: delete "Electroce" and insert --Electrode--.

In the Specification:

6.) Column 4, Line 36: after "epitaxial Ge", insert --.--.

7.) Column 6, Line 6: delete "N-2 well" and insert --N-2well--.

Signed and Sealed this
Twenty-second Day of October, 2013

Teresa Stanek Rea
*Deputy Director of the United States Patent and Trademark Office*